(12) United States Patent
Kang et al.

(10) Patent No.: US 8,824,150 B2
(45) Date of Patent: Sep. 2, 2014

(54) DRIVING PRINTED CIRCUIT BOARD AND LIQUID CRYSTAL DISPLAY DEVICE INCLUDING THE SAME

(75) Inventors: JungYoul Kang, Gyeongsangbuk-do (KR); SeongHun Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 130 days.

(21) Appl. No.: 13/408,821

(22) Filed: Feb. 29, 2012

(65) Prior Publication Data
US 2013/0128474 A1   May 23, 2013

(30) Foreign Application Priority Data
Nov. 23, 2011 (KR) .................. 10-2011-0123038

(51) Int. Cl.
| | |
|---|---|
| H05K 5/00 | (2006.01) |
| H05K 7/00 | (2006.01) |
| H05K 1/14 | (2006.01) |
| H05K 1/00 | (2006.01) |
| H05K 1/18 | (2006.01) |
| H01R 12/00 | (2006.01) |
| H05K 1/02 | (2006.01) |
| G02F 1/133 | (2006.01) |
| G02F 1/13 | (2006.01) |

(52) U.S. Cl.
CPC ........ *H05K 1/0271* (2013.01); *H05K 2201/058* (2013.01); *G02F 1/133* (2013.01); *H05K 1/0278* (2013.01); *H05K 2201/0154* (2013.01); *H05K 1/028* (2013.01); *H05K 2201/09681* (2013.01); *H05K 1/0281* (2013.01); *G02F 1/13* (2013.01); *H05K 2201/2009* (2013.01); *H05K 2201/10136* (2013.01); *H05K 1/02* (2013.01); *H05K 2201/10128* (2013.01); *H05K 1/00* (2013.01)
USPC ...... 361/749; 361/679.01; 361/736; 361/748; 361/750; 361/751; 361/752; 361/753; 361/757; 361/777; 174/254; 439/66; 439/67

(58) Field of Classification Search
CPC ............... H05K 2201/0154; H05K 2201/058; H05K 2201/09681; H05K 2201/10128; H05K 2201/10136; H05K 2201/2009; H05K 1/00; H05K 1/02; H05K 1/0271; H05K 1/0278; H05K 1/028; H05K 1/0281
USPC ............ 361/749, 679.01, 736, 748, 750, 751, 361/752, 753, 757, 777; 174/254; 439/66, 439/67; 345/204; 29/832
See application file for complete search history.

(56) References Cited

U.S. PATENT DOCUMENTS

| | | | |
|---|---|---|---|
| 6,675,470 B2 * | 1/2004 | Muramatsu | 29/832 |
| 6,739,878 B1 * | 5/2004 | Balzano | 439/67 |
| 2010/0252307 A1 * | 10/2010 | Mo | 174/254 |

* cited by examiner

*Primary Examiner* — Anthony Haughton
*Assistant Examiner* — Zhengfu Feng
(74) *Attorney, Agent, or Firm* — Fenwick & West LLP

(57) ABSTRACT

The present disclosure discloses a driving printed circuit board (PCB) for use in a display device. More particularly, a driving printed circuit board improving the bonding by preventing PCB warpage is provided. The rear surface stiffener plate includes polygonal patterns to prevent a PCB warpage of the driving printed circuit board due to different heat shrinkage from that of the board during the surface mounting technology (SMT) process.

18 Claims, 4 Drawing Sheets

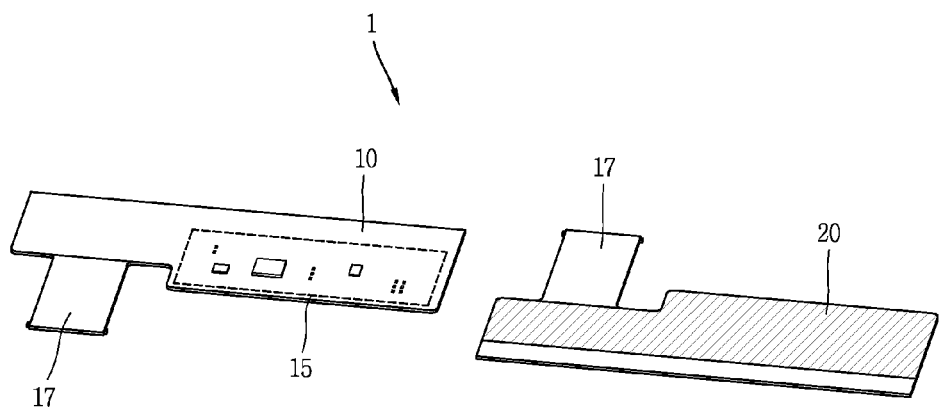
FIG. 1A
PRIOR ART
FIG. 1B
PRIOR ART
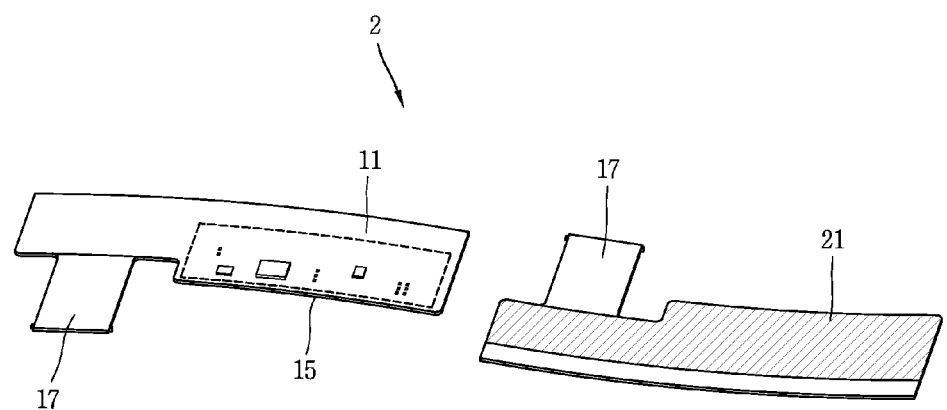
FIG. 2A
PRIOR ART
FIG. 2B
PRIOR ART

DRIVING PRINTED CIRCUIT BOARD AND LIQUID CRYSTAL DISPLAY DEVICE INCLUDING THE SAME

CROSS-REFERENCE TO RELATED APPLICATIONS

This application claims priority to Korean Patent Application No. 10-2011-0123038, filed on Nov. 23, 2011, which is hereby incorporated by reference in its entirety.

BACKGROUND OF THE INVENTION

1. Field of the Invention

The present invention relates to a printed circuit board (PCB), and more particularly, to a PCB with reduced likelihood of a bonding failure due to warpage caused by a surface mounting technology (SMT) process to mount electronic components.

2. Description of the Related Art

As flat panel displays such as organic electroluminescent display devices become thinner and more integrated, liquid crystal display devices are structured to make use of a flexible PCB (FPCB) or rigid-flexible PCB mounted with a plurality of integrated circuits (ICs) to provide connection to a liquid crystal panel. These PCBs use a wire bonding or tape automated bonding (TAB) process to connect components of the flat panel displays.

FIG. 1A is a perspective view illustrating the front surface of a conventional driving printed circuit board provided in a liquid crystal display device. The driving printed circuit board 1 may include a base portion 10, a plurality of control elements 15 bonded to the front surface of the base portion 10, and a flexible portion 17 connecting the base portion 10 to a liquid crystal panel.

Various control elements 15 for controlling a liquid crystal panel and external elements constituting a liquid crystal display device are mounted through a surface mounting technology (SMT) process onto the front surface of the base portion 10. The base portion 10 is made of a single or plural layer structure, and a plurality of pads bonded to the mounted control elements 15 and a plurality of wirings electrically connecting between the pads are formed thereon.

At least one of the control elements 15 may be bonded to a front surface of the base portion 10 through an SMT process, and electrically connected to one another via pads and wirings formed on the base portion 10, and also connected to a liquid crystal panel and other external elements through the flexible portion 17.

The flexible portion 17 can be easily bent without cracking or rupturing to electrically connect the driving printed circuit board 1. The flexible portion 17 may be bent during the module assembly process of a liquid crystal display device and the base portion 10 may be disposed at a rear surface thereof.

FIG. 1B is a perspective view illustrating the rear surface of a conventional driving printed circuit board. A rear surface stiffener plate 20 may be attached to a rear surface thereof to maintain the rigidity of the base portion 10.

The rear surface stiffener plate 20 may be attached to prevent pads and wirings from being disconnected due to the damage of the bonding portion caused when the base portion 10 mounted with the control elements 15 is bent. A polyimide film may be typically used as the rear surface stiffener plate 20. Commercialized polyimide film includes, for example, KAPTON (of DuPont Co.).

However, the method of performing an SMT process using a driving printed circuit board attached to the rear surface stiffener plate 20 may have the following problems.

FIGS. 2A and 2B are views illustrating the front surface of a conventional driving printed circuit board 2 and the rear surface of the same driving printed circuit board 2 after undergoing a conventional SMT process. As illustrated in FIGS. 2A and 2B, the driving printed circuit board 2 is flexible and has a thermal expansion coefficient different from that of the rear surface stiffener plate 21 attached to the driving printed circuit board. The difference in the thermal expansion coefficient causes the driving printed circuit board 2 to be warped as shown in FIGS. 2A and 2B under the pressurization and heating step of the SMT process.

In other words, the degree of contraction in a polyimide film (forming the rear surface stiffener plate 21) is larger than the degree of contraction in the base portion 11 during the cooling stage after the SMT process. The different degrees of contraction cause the base portion 11 to be bent in a rear surface direction after the SMT process. As a result, the mounted control elements 15 may be distorted, or wiring patterns in the printed circuit board 2 may become disconnected.

Such PCB warpage of the printed circuit board may deteriorate the reliability of a driving printed circuit board. Moreover, an additional work may be required to flatten the board after undergoing an SMT process, which causes increase in the time for fabricating the printed circuit board.

SUMMARY OF THE INVENTION

Embodiments relate to a printed circuit board (PCB) including a base portion and a stiffener plate configured to have geometric patterns to avoid warpage of the PCB during or after heating of the PCB for mounting electrical components to a surface of the base portion. The base portion includes wiring patterns and having a flat shape. The electrical components are mounted on a first surface of the base portion.

In one or more embodiments, the geometric patterns include a polygonal shape or a curved shape. The geometric patterns may be hexagonal cells and bridges connecting edges of the plurality of the hexagonal cells.

In one or more embodiments, each of the plurality of hexagonal cells has the same dimension and shape.

In one or more embodiments, the bridges are thinner and shorter than a width of a hexagonal cell.

In one or more embodiments, the stiffener plate includes a polyimide film.

In one or more embodiments, the stiffener plate covers at least a region of the second surface opposite to a region of the first surface where the one or more components are mounted.

In one or more embodiments, a width of each polygon in the polygonal pattern is 4.5 to 5.5 mm and a distance between each polygon is 0.7 to 0.9 mm.

In one or more embodiments, the PCB further comprises a flexible portion extending from the base portion for connecting the PCB to another component in the display device. The stiffener plate does not cover the flexible portion.

In one or more embodiments, the PCB is connected to a liquid crystal panel for displaying an image. The PCB transmits signals to the liquid crystal panel for operating pixel regions in the liquid crystal panel.

BRIEF DESCRIPTION OF THE DRAWINGS

The accompanying drawings, which are included to provide a further understanding of the invention and are incor- FIG. 1A is a perspective view illustrating the front surface of a conventional driving printed circuit board provided in a liquid crystal display device.

FIG. 1B is a perspective view illustrating the rear surface of a conventional driving printed circuit board of FIG. 1A.

FIGS. 2A and 2B are views illustrating a conventional driving printed circuit board after undergoing an SMT process.

DETAILED DESCRIPTION OF THE INVENTION

Figures 3A, 3B:
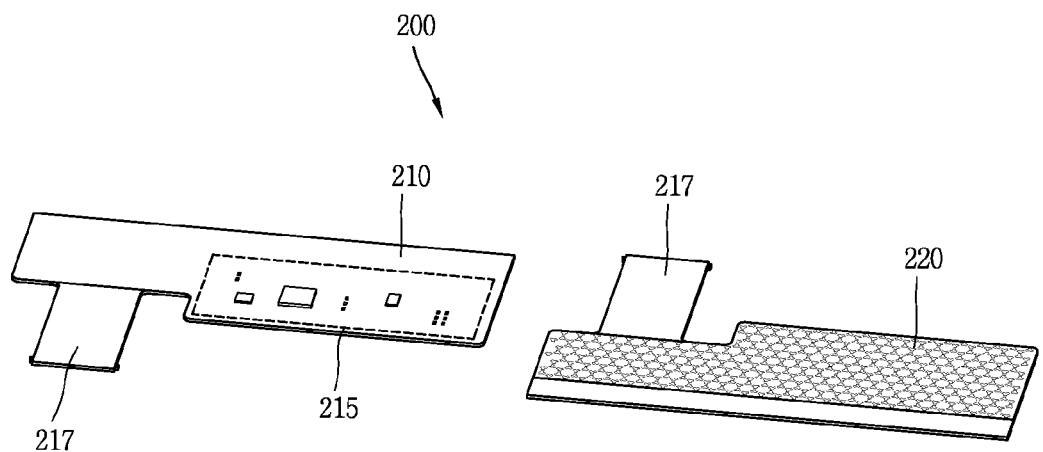
FIG. 3A is a perspective view illustrating the front surface of a driving printed circuit board according to an embodiment of the present invention.
FIG. 3B is a perspective view illustrating the rear surface of the driving printed circuit board of FIG. 3A.

Hereinafter, according to a preferred embodiment of the present invention, a driving printed circuit board and a liquid crystal display device including the same will be described with reference to the accompanying drawings. In the following description, the reference drawings are not intended to limit the shapes and positions of elements to the specific form disclosed. In particular, in the drawings, the scale of some these elements may be arbitrarily enlarged or reduced to enhance the understanding of the structure and shape of a driving printed circuit board, which is a technical feature of the present invention.

FIG. 3A is a perspective view illustrating the front surface of a driving printed circuit board 200 according to an embodiment of the present invention. FIG. 3B is a perspective view illustrating the rear surface of a driving printed circuit board 200 according to an embodiment of the present invention. The driving printed circuit board 200 according to the present invention may include a base portion 210 mounted with various elements, a plurality of control elements 215 bonded to the front surface of the base portion 210, a flexible portion 217 configured to electrically connect the base portion 210 to a liquid crystal panel, and a rear surface stiffener plate 220 provided at a rear surface of the base portion 210.

More specifically, various control elements 215 for controlling a liquid crystal panel and other external elements included in a liquid crystal display device may be mounted on the base portion 210, through a surface mounting technology (SMT) process. The base portion is made of a single or a plurality of layers.

A plurality of pads and a plurality of wirings (for electrically connecting the pads) may be formed on the base portion 210. The control elements 215 may be mounted by (i) coating a solder on each pad, (ii) disposing one or more control elements 215 on the solder and then (iii) performing a pressurization and heating step of the SMT process.

At least one of the control elements 215 may be bonded to a front surface of the base portion 210, and electrically connected to one another via pads and wirings formed on the base portion 210. The control elements 215 are also connected to a liquid crystal panel and other external elements through the flexible portion 217.

The flexible portion 217 is formed with a plurality of wirings extending from the base portion 210 to electrically connect the driving printed circuit board 200 to external elements. The flexible portion is flexible and can be easily bent. Also, a connector may be formed at an end of the flexible portion 217 for connecting to an external element such as a liquid crystal panel or driving IC. The flexible portion 217 may be bent for connection when the driving printed circuit board 200 is mounted on the liquid crystal display device. The base portion 210 may be positioned at a rear surface of the liquid crystal display device.

The rear surface stiffener plate 220 may be provided to maintain the rigidity of the base portion 210, and can be formed or attached on the rear surface of the base portion 210. The rear surface is a surface where the control elements 215 are not located. The rear surface stiffener plate 220 may be formed or attached over a broad area of the rear surface of the base portion 210 except the region of the flexible portion 217. The rear surface stiffener plate 220 may comprise a polyimide film such as KAPTON or the like.

Embodiments include geometric patterns formed on the rear surface stiffener plate 220. The geometric patterns have a predetermined size are repeated and separated from one another by a predetermined distance. The geometric patterns may include one or more of polygonal shapes, ellipses, circles and irregular shapes that are connected by bridges.

The patterns may be configured so that the overall thermal expansion of the rear surface stiffener plate 220 is reduced. The base portion 210 generally has a low thermal expansion coefficient, and therefore, the base portion does not expand or contract significantly compared to the stiffener plate 220. In contrast, the stiffener plate 220 has a higher thermal expansion coefficient. By reducing the amount of material (e.g., polyimide film) used in the stiffener plate 220, the thermal expansion or thermal contraction of the stiffener plate 220 can be reduced. The reduced thermal expansion or contraction results in decreased stress and strain, therefore, decreasing warping or bending of the driving printed circuit board 200.

Furthermore, the geometric patterns have a structure in which the interacting forces between adjoining geometric patterns are balanced to minimize bending of the base portion 210. In one embodiment, the geometric patterns include hexagonal shapes connected by bridges into a honeycomb structure, as described below in detail with reference to FIG. 4. The hexagonal shape is advantageous, among other reasons, because when the hexagonal shapes are aligned into a honeycomb shaped structure, the stiffener plate 220 is not particularly vulnerable to folding along an axis or direction. That is, the hexagonal patterns have an advantage of reducing the likelihood of being folded along the gapped portions between the patterns.

Figure 4:
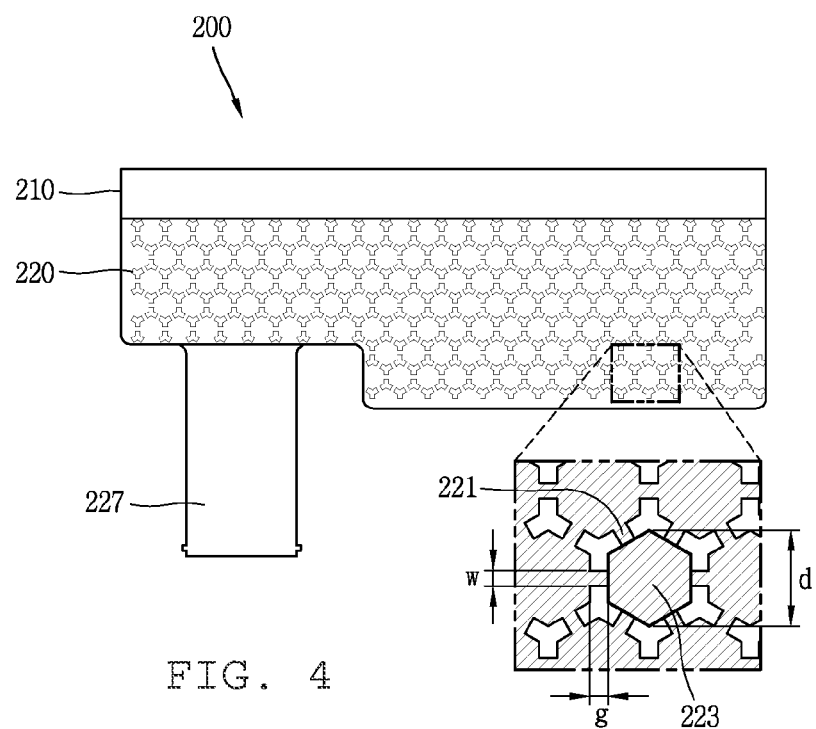
FIG. 4 is an enlarged view illustrating a rear surface of the driving printed circuit board and a region of a rear surface stiffener plate attached to the rear surface according to an embodiment of the present invention.

Hereinafter, a rear surface stiffener plate of the driving printed circuit board and a geometric pattern structure thereof according to an embodiment of the present invention will be described with reference to the accompanying drawings. FIG. 4 is an enlarged view illustrating a rear surface of the driving printed circuit board 200 and a partial region of a rear surface stiffener plate 200 formed or attached to the rear surface according to an embodiment of the present invention. The rear surface stiffener plate 220 of the driving printed circuit board 200 is formed on or attached to the rear surface of the driving printed circuit board 200 except for a top part 210 of the base portion and the flexible portion 227. Geometric patterns 223 with a predetermined width d may be formed repeatedly over the rear surface stiffener plate 220.

Referring to the enlarged view of the rear surface stiffener plate 220, the geometric patterns 223 are regular hexagon cells with an interior angle of 120° that are separated from one another by a predetermined distance. The hexagon cells face one another at all edges.

In one embodiment, the hexagonal cells are connected to each other via bridges 221 having a width w and a length g. The width of the hexagonal cell is indicated by distance d between two vertices facing each other, as illustrated in FIG. 4. The ratio (w/d) between the width (d) of the hexagonal cell and the width (w) of the bridges is 5 to 7.9. The ratio (d/g) between the width (d) of the hexagonal cell and the length (g) of the bridge is 5.56 to 11.3. Specifically, the width w of the hexagonal cell may be 4.5 to 5.5 mm, and the separation distance g between adjacent polygonal patterns 223 may be 0.7 to 0.9 mm. Further, the width w of the bridge 221 may be 0.4 to 0.6 mm.

The aforementioned separated distance (g) should be formed to have a minimum allowable value for patterning because a force supporting the base portion 210 is decreased as increasing the separated distance (g). Furthermore, the dummy portion is likely to be disconnected during heat shrinking if the width thereof is too narrow, and adjoining polygonal patterns 221 are likely to be drawn from one another due to heat contraction if the width thereof is too wide.

The cells in the stiffener plate 220 may have shapes other than a hexagonal shape. For example, the cells may have curved shape (e.g., circles or ellipse), irregular shape or other polygonal shapes (e.g., triangle or square).

Even when the rear surface stiffener plate 220 contracts by cooling after the SMT process, each of the polygonal patterns 221 individually contracts without substantially causing strain or stress in adjacent patterns due to contraction. Therefore, the driving printed circuit board 200 does not suffer from warpage due to heat treatment. Further, although not shown in FIG. 4, the polygonal patterns 223 may be formed on or attached to only the portion of the rear surface of the base portion 210 that are subject to severe pressure and heat. For example, pressure and heat may be concentrated on a region on the front surface of the base portion 210 where control elements are bonded by the SMT process. In such example, the rear surface stiffener plate 220 is formed on or attached only to the region corresponding to the central portion. Alternatively, if control elements are bonded to a side portion of the base portion 210, the polygonal patterns 223 may be formed on or attached to the side region.

Figure 5:
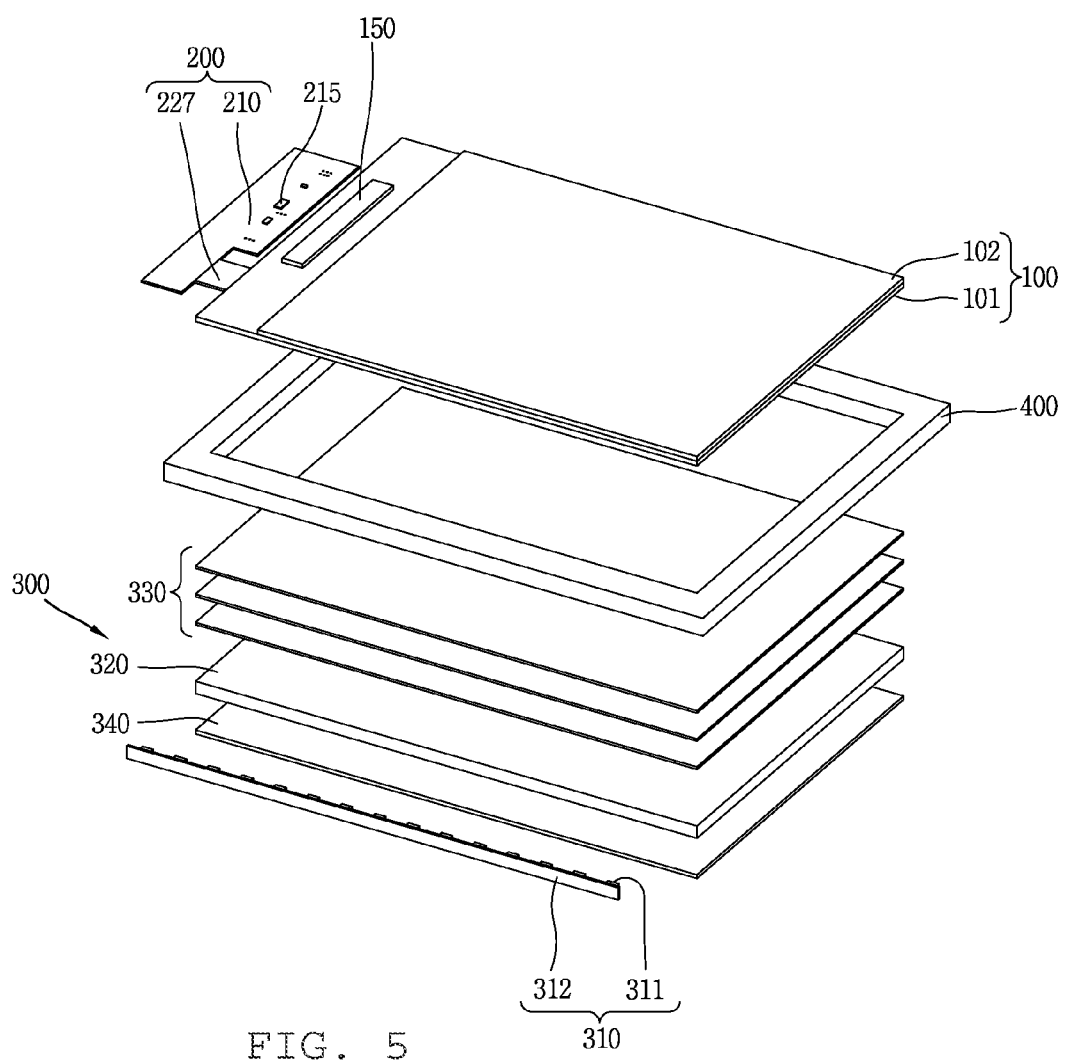
FIG. 5 is an exploded perspective view illustrating a liquid crystal display device including a driving printed circuit board of the present invention.

Hereinafter, a liquid crystal display device having a driving printed circuit board according to an embodiment of the present invention will be described with reference to the accompanying drawing. FIG. 5 is an exploded perspective view illustrating a liquid crystal display device including a driving printed circuit board of the present invention. As illustrated in FIG. 5, a liquid crystal display device according to the present invention may include liquid crystal panel 100 for displaying an image and a backlight unit 300 for providing light to the liquid crystal panel 100. The liquid crystal panel 100 and the backlight unit 300 are combined with each other via a guide panel 400.

First, the liquid crystal panel 100 may include a first substrate 101, a second substrate 102 separated from the first substrate 101 by a predetermined distance, and a liquid crystal layer interposed between the first and second substrates 101, 102. Typically, the first substrate 101 are formed to be larger than the second substrate 102, and a driving integrated circuit (IC) 150 may be mounted on a region of the first substrate not overlapping with the second substrate 102. The first substrate 101 may be connected to a connector (not shown) of the driving printed circuit board 200 electrically connected thereto.

The foregoing liquid crystal panel 100 may generate an image in response to receiving various signals from the driving IC 150. Thin-film transistors (functioning as switching devices), various wirings, and a pixel electrode are formed on the first substrate 101. A color filter and a black matrix (BM) form a color filter substrate. A common electrode facing the pixel electrode is formed on the second substrate 102. The foregoing common electrode may be formed on the first substrate 101 instead of the second substrate 102, based on the driving method of the liquid crystal panel.

More specifically, a plurality of gate wirings and data wirings are formed on the first substrate 101. The data wirings are arranged in a matrix form to define pixel regions at the crossing points. Thin-film transistors (functioning as switching devices) are formed at each pixel region. Further, the thin-film transistor may include a gate electrode connected to a gate wiring, a semiconductor layer formed and deposited with amorphous silicon at an upper portion of the gate electrode. A source electrode and a drain electrode are formed on the semiconductor layer for electrical connection to a data wiring and a pixel electrode.

The second substrate 102 may include a color filter including a plurality of sub-color filters implementing red, green and blue colors, a black matrix (BM) for splitting each sub-color filter and blocking the light transmitted through the liquid crystal layer, and a common electrode facing the pixel electrode of the first substrate 101. The common electrode may be formed in parallel with the pixel electrode on the first substrate 101 instead of the second substrate 10 in case of an in-plane switching mode according to the driving method of the liquid crystal panel 100.

The first and second substrates 101, 102 having the foregoing configuration are assembled to face each other by a sealant formed at the outside of an image display region. Liquid crystals are interposed between the first and second substrate 101, 102 to constitute the liquid crystal panel 100. Further, although not shown in FIG. 5, a first polarizing plate and a second polarizing plate are formed on or attached to an outer surface of the first and second substrate 101, 102 to polarize light incident to or exited from the liquid crystal panel 100 to display an image.

The driving IC 150 may include a gate driving unit for providing scan signals to turn on or off the foregoing thin-film transistor and a data driving unit for providing data signals to the pixel electrodes, which are electrically connected to each other via the flexible portion 227 of the driving printed circuit board.

In the driving printed circuit board 200, at least one of the control elements 215 are mounted at a front surface of the base portion 210 using a rigid-flexible SMT process, and the flexible portion 227 having a flexible material protruded in one direction from a lateral surface of the base portion 210 is connected to the first substrate 101 of the liquid crystal panel 100, and the flexible portion 227 is mounted on the liquid crystal display device as the flexible portion 227 is folded in a rear surface direction of the liquid crystal panel 100.

Also, though not shown in the drawing, a rear surface stiffener plate (not shown) for preventing bending and maintaining rigidity may be formed on or attached to the rear surface of the driving printed circuit board 200. The rear surface is an opposite side of the driving printed circuit board of the front surface where control elements are on the base portion 210. The portion of the printed circuit board 200 where the control elements are mounted are maintained in a flat shape without bending, contrary to the flexible portion 227.

The backlight unit 300 may include an LED lamp 311 having a plurality of light sources disposed in a lower one side direction of the liquid crystal panel 100 to emit light, an LED array 310 configured with a lamp substrate 312 bonded to the LED lamp 311, a light guide plate 320 disposed at a lower portion of the liquid crystal panel 100 to guide light emitted from the LED lamp 311 to the liquid crystal panel 100, an optical sheet 330 made of one or more diffusion sheets and prism sheets provided between the liquid crystal panel 100 and the light guide plate 320 to diffuse and concentrate light guided by the light guide plate 320, and a reflection plate 340 configured to reflect light being exited in a downward direction from the light guide plate 320 again to the direction of the light guide plate 320.

Although the LED lamp 311 is disposed at one lateral surface of the light guide plate 320 (functioning as an edge-light-type backlight unit in FIG. 5), a direct-light-type backlight unit may be also applicable where the LED lamp 311 is disposed at a rear surface of the liquid crystal panel 100 without using the light guide plate 320.

The liquid crystal panel 100 and backlight unit 300 having the foregoing structure may be mounted within a guide panel 400. The guide panel 400 may be a rectangular synthetic resin frame structure in which the liquid crystal panel 100 is placed. The backlight unit 300 may be surrounded by the guide panel 400.

Accordingly, the liquid crystal panel 100 may be placed at an upper portion of each edge of the guide panel 400, and the backlight unit 300 may be disposed at a rear surface of the liquid crystal panel 100 inside the guide panel 400. Although not shown in FIG. 5, a light-shielding tape for effectively shielding light being leaked from a gap may be provided at a combining portion between the guide panel 400 and the liquid crystal panel 100.

Also, the foregoing reflection plate 340 may be attached to a rear surface of the guide panel 400 to support a rear surface portion of the liquid crystal display device.

Figure 6:
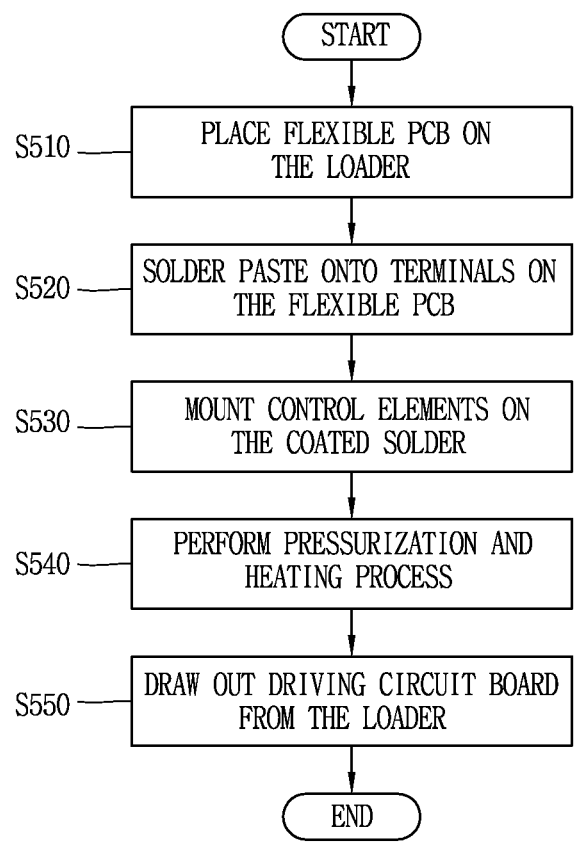
FIG. 6 is a flow chart of the SMT process for fabricating a driving printed circuit board according to an embodiment of the present invention.

Hereinafter, the SMT process of a driving printed circuit board for bonding control elements according to an embodiment of the present invention will be described with reference to FIG. 6. FIG. 6 is a flow chart for explaining the SMT process of a driving circuit board to which a rear surface stiffener plate having polygonal patterns is applied according to the present invention.

The SMT process of a driving printed circuit board according to the present invention may include placing S510 a flexible printed circuit board on a loader. The flexible printed circuit board with a rear surface stiffener plate formed in polygonal patterns on its rear surface of the base portion is loaded on the loader to prepare a bonding process. A carrier jig for stably supporting the base portion may be provided on the loader to prevent a bonding failure of the printed circuit board during the SMT process. Accordingly, prior to mounting the flexible circuit board on the loader, the process of forming polygonal patterns on the rear surface stiffener plate, and adhering it to a rear surface of the flexible circuit board can be added.

Solder paste is coated S520 at terminals on the flexible printed circuit board. The solder paste is coated on the bonding positions of the elements of the base portion, for example, on electrodes corresponding to the input/output terminals of the control elements.

Control elements are mounted S530 on the coated solder. Control elements are placed on electrodes coated with the solder using a SMT automatic equipment.

Pressurization and heating process is then performed S540. The solder coated on the printed circuit board is melted by applying heat using reflow soldering equipment to solder control elements onto the terminals of the base portion. The heating temperature may be around 220° C.

Pressurization and heating process is then performed S540. Shrinking due to heat occurs on both the base portion and rear surface stiffener plate. The rear surface stiffener plate shrinks to a larger degree than the base portion. However, a plurality of polygonal patterns formed spaced from each other are individually shrunk on the rear surface stiffener plate to minimize mutual effects thereof, and thus, the stress caused by shrinking is not transferred to the base portion.

Then the driving printed circuit board from the loader is removed S550 from the loader. A flexible printed circuit board that has completed a reflow soldering process is supplied from the previous equipment is drawn out from the loader to finish a driving printed circuit board.

As a result, a driving printed circuit board according to the present invention may maintain a flat level of the original base portion.

Although a preferred embodiment of the present invention have been described as described above, it should be understood by those skilled in the art that various modifications and equivalent other embodiments of the present invention can be made from the embodiment presented herein.

What is claimed is:

1. A display device comprising a printed circuit board (PCB), the printed circuit board comprising:
   a base portion including wiring patterns and having a flat shape;
   a flexible portion extending from the base portion for connecting the printed circuit board to another component in the display device;
   one or more electrical components mounted on a first surface of the base portion and connected to the wiring patterns, wherein the one or more electrical components are mounted on the first surface of the base portion by pressurizing or heating at least a part of the base portion;
   a stiffener plate attached to or formed on a second surface of the base portion opposite to the first surface, wherein the stiffener plate comprises a plurality of polygonal patterns and bridges connecting the polygonal patterns, each of the plurality of polygonal patterns having a width larger than a width of each of the bridges; and
   wherein the polygonal patterns and the bridges are of same material.

2. The display device of claim 1, wherein the polygonal patterns have a hexagonal shape.

3. The display device of claim 2, wherein each of the plurality of polygonal patterns has a same dimension and shape.

4. The display device of claim 1, wherein each of the bridges is shorter than the width of each of the polygonal patterns.

5. The display device of claim 1, wherein the stiffener plate comprises a polyimide film.

6. The display device of claim 1, wherein the stiffener plate covers at least a region of the second surface opposite to a region of the first surface where the one or more components are mounted.

7. The display device of claim 1, wherein a ratio between the width of each of the polygonal patterns and the width of each of the bridges is 5 to 7.9, and a ratio between the width of each of the polygonal patterns and a length of each of the bridges is 5.56 to 11.3.

8. The display device of claim 7, wherein the width of each of the polygonal patterns is 4.5 to 5.5 mm and a distance between each of the polygonal patterns is 0.7 to 0.9 mm.

9. The display device of claim 1, wherein the stiffener plate does not cover the flexible portion.

10. A printed circuit board, comprising:
a base portion including wiring patterns and having a flat shape;
a flexible portion extending from the base portion for connecting the printed circuit board to another component in a display device;
one or more electrical components mounted on a first surface of the base portion and connected to the wiring patterns, wherein the one or more electrical components are mounted on the first surface of the base portion by pressurizing or heating at least a part of the base portion; and
a stiffener plate attached to or formed on a second surface of the base portion opposite to the first surface, wherein the stiffener plate comprises a plurality of polygonal patterns and bridges connecting the polygonal patterns, each of the plurality of polygonal patterns having a width larger than a width of each of the bridges; and
wherein the polygonal patterns and the bridges are of same material.

11. The printed circuit board of claim 10, wherein the polygonal patterns have a hexagonal shape.

12. The printed circuit board of claim 11, wherein each of the plurality of polygonal patterns has a same dimension and shape.

13. The printed circuit board of claim 10, wherein each of the bridges is shorter than a width of each of the polygonal patterns.

14. The printed circuit board of claim 10, wherein the stiffener plate comprises a polyimide film.

15. The printed circuit board of claim 10, wherein the stiffener plate covers at least a region of the second surface opposite to a region of the first surface where the one or more components are mounted.

16. The printed circuit board of claim 10, wherein a ratio between the width of each of the polygonal patterns and the width of each of the bridges connected to the cell is 5 to 7.9, and a ratio between the width of each of the polygonal patterns and the length of each of the bridges is 5.56 to 11.3.

17. The printed circuit board of claim 16, wherein the width of each of the polygonal patterns is 4.5 to 5.5 mm and a distance between each of the polygonal patterns is 0.7 to 0.9 mm.

18. The printed circuit board of claim 10, wherein the stiffener plate does not cover the flexible portion.

* * * * *